United States Patent
Yatabe

(10) Patent No.: US 9,893,405 B2
(45) Date of Patent: Feb. 13, 2018

(54) INPUT/OUTPUT COUPLING STRUCTURE OF DIELECTRIC WAVEGUIDE

(71) Applicant: TOKO, INC., Tsurugashima-shi (JP)

(72) Inventor: Yukikazu Yatabe, Tsurugashima (JP)

(73) Assignee: Murata Manufacturing Co., Ltd., Nagaokakyo-Shi (JP)

( * ) Notice: Subject to any disclaimer, the term of this patent is extended or adjusted under 35 U.S.C. 154(b) by 25 days.

(21) Appl. No.: 15/211,185

(22) Filed: Jul. 15, 2016

(65) Prior Publication Data
US 2017/0018834 A1    Jan. 19, 2017

(30) Foreign Application Priority Data

Jul. 17, 2015   (JP) .................................. 2015-142733
Apr. 20, 2016  (JP) .................................. 2016-084096

(51) Int. Cl.
*H01P 5/107*  (2006.01)
*H01P 5/08*   (2006.01)
(Continued)

(52) U.S. Cl.
CPC ................ *H01P 5/087* (2013.01); *H01P 3/16* (2013.01); *H01P 5/107* (2013.01); *H05K 1/0242* (2013.01); *H05K 1/115* (2013.01); *H01P 3/122* (2013.01)

(58) Field of Classification Search
CPC .. H01P 5/08; H01P 5/087; H01P 5/107; H01P 3/16
(Continued)

(56) References Cited

U.S. PATENT DOCUMENTS 5,471,181 A * 11/1995 Park ....................... H01P 5/028
                                                                  333/246
6,498,550 B1    12/2002 Miller et al.
(Continued)

FOREIGN PATENT DOCUMENTS

JP    H 08 139504    5/1996
JP    2000-049506    2/2000
(Continued)

OTHER PUBLICATIONS

Search Report dated Dec. 13, 2016 which issued in the corresponding European Patent Application No. 160015772.2.
(Continued)

*Primary Examiner* — Dean Takaoka
(74) *Attorney, Agent, or Firm* — Cozen O'Connor

(57) ABSTRACT

Dielectric waveguide comprising dielectric body having an exterior coated with an electrically conductive film. Region in one side surface couples to another dielectric waveguide, and slot in bottom surface exposes the dielectric body in an L-shape in two adjacent side surfaces, except for the one side surface. Front surface of printed circuit board has a ground pattern opposed to the slot, which includes opening with outer shape greater than slot, and a back surface having a ground pattern surrounding a strip line disposed to cross through the slot. A distal end of the strip line and the front surface-side ground pattern are coupled together by a via hole. The opening is surrounded by a via hole group which couples the front and the back surface-side ground patterns together. The dielectric waveguide is disposed to allow the opening and the slot to be opposed to each other.

4 Claims, 5 Drawing Sheets

(51) Int. Cl.
*H01P 3/16* (2006.01)
*H05K 1/02* (2006.01)
*H05K 1/11* (2006.01)
*H01P 3/12* (2006.01)

(58) Field of Classification Search
USPC .................................................. 333/24 R
See application file for complete search history.

(56) References Cited

U.S. PATENT DOCUMENTS

| | | | | |
|---|---|---|---|---|
| 6,507,321 | B2* | 1/2003 | Oberschmidt | H01Q 13/106 343/767 |
| 6,535,085 | B2* | 3/2003 | Song | H01P 7/065 333/219 |
| 6,977,560 | B2* | 12/2005 | Itoh | H01P 5/1022 333/230 |
| 7,486,156 | B2* | 2/2009 | Lee | H01P 5/107 333/26 |
| 7,675,391 | B2* | 3/2010 | Chuang | H01P 1/047 333/202 |
| 7,872,550 | B2* | 1/2011 | Chuang | H01P 1/047 333/208 |
| 8,729,979 | B2* | 5/2014 | Kojima | H01P 5/087 333/248 |
| 9,666,931 | B2* | 5/2017 | Suzuki | H01P 5/107 |
| 9,780,427 | B2* | 10/2017 | Zhou | H01P 1/20309 |
| 2016/0359215 | A1* | 12/2016 | Yatabe | H01P 1/2002 |

FOREIGN PATENT DOCUMENTS

| | | |
|---|---|---|
| JP | 2002-043807 | 2/2002 |
| WO | WO 01/84665 | 11/2001 |

OTHER PUBLICATIONS

Chien et al. "Miniaturized Bandpass Filters with Double-Folded Substrate Integrated Waveguide Resonators in LTCC", IEEE Transactions on Microwave Theory and Techniques, vol. 57, No. 7, Jul. 2009, pp. 1774-1782.

Toko: "General Catalog", Jan. 1, 2013, pp. 1-28.

Toko: "Dielectric Waveguide Filters" Datasheet model "WDFMB-25000Z-10-01", Jan. 1, 2013 (1 page).

* cited by examiner

INPUT/OUTPUT COUPLING STRUCTURE OF DIELECTRIC WAVEGUIDE

RELATED APPLICATIONS

This application claims the priority of Japanese Patent Application Nos. 2015-142733 filed on Jul. 17, 2015 and 2016-084096 filed on Apr. 20, 2016, the entire content of both of which is hereby incorporated by reference.

BACKGROUND OF THE INVENTION

1. Field of the Invention

The present invention relates to an input/output coupling structure between a dielectric waveguide and a printed circuit board on which the dielectric waveguide is to be mounted, and, more particularly, to a bandwidth widening technique for the input/output coupling structure.

2. Description of the Related Art

In recent years, mobile communications devices have become widespread, and frequencies of GHz bands have come to be used for communications therebetween. Then, in a base station which relays the communication between the mobile communications devices, a dielectric waveguide filter has been used which comprises a combination of a plurality of waveguide resonators.

The dielectric waveguide filter can be dramatically downsized due to a wavelength shortening effect of dielectric body as compared to a conventional cavity waveguide, and thereby can be utilized while being directly mounted on a printed circuit board.

However, the dielectric waveguide, and a strip line used in the printed circuit board, are different from each other in terms of a transmission mode of electromagnetic wave. Thus, in the case of using the dielectric waveguide such as the dielectric waveguide filter while being directly mounted on the printed circuit board, it is necessary to provide an input/output coupling structure having a wideband characteristic for converting a mode from the strip line to the dielectric waveguide.

FIG. 5 is an exploded perspective view illustrating an example of a conventional dielectric waveguide input/output coupling structure described in JP 2000-049506A, showing a case of a dielectric waveguide 1 mounted on a surface of a printed circuit board 4. In FIG. 5, a region exposing the dielectric body is slashed.

As illustrated in FIG. 5, the dielectric waveguide 1 comprises an approximately rectangular parallelepiped-shaped dielectric body having an exterior coated with an electrically conductive film.

The dielectric waveguide 1 has a side surface provided with a coupling window 2 exposing the dielectric body, for coupling to other dielectric waveguide which is not illustrated, and a bottom surface provided centrally with an approximately quadrangular shaped electrode 3 surrounded by an electrically conductive film in spaced-apart relation thereto.

The printed circuit board 4 has a front surface-side ground pattern 5 provided on a front surface of a substrate 7, and a back surface-side ground pattern 6 provided on a back surface of the substrate 7.

The printed circuit board 4 has a front surface provided with an approximately quadrangular shaped electrode 5a surrounded by the front surface-side ground pattern 5 in spaced-apart relation thereto, and a back surface provided with a strip line 6a disposed in spaced-apart relation to the back surface-side ground pattern 6.

A center of the electrode 5a and a distal end of the strip line 6a are coupled together by a via hole 7.

The dielectric waveguide 1 is mounted on the printed circuit board 4 in such a manner as to allow the electrode 3 provided on the dielectric waveguide and the electrode 5a provided on the printed circuit board 4 to be opposed to each other.

BRIEF SUMMARY OF THE INVENTION

Problem to be Solved by the Invention

The above-described conventional dielectric waveguide input/output coupling structure has a problem of having a limitation in the degree of coupling between the dielectric waveguide and the strip line, which makes it difficult to have a wideband characteristic.

Means for Solving the Problem

In order to solve the above problem, according to one aspect of the present invention, there is provided a dielectric waveguide input/output coupling structure for coupling an electrode of a dielectric waveguide and a strip line on a printed circuit board together, the dielectric waveguide being configured to be coupled to other dielectric waveguide, wherein: the dielectric waveguide comprises an approximately rectangular parallelepiped-shaped dielectric body having an exterior coated with an electrically conductive film, and has one side surface having a coupling region for coupling to other dielectric waveguide, and a bottom surface having a slot for exposing the dielectric body in an L-shape, the L-shape being formed by two linear slots crossing with each other at their end portions, each of the linear slots being parallel to respective one of two adjacent side surfaces, except for the one side surface, of the dielectric waveguide; the printed circuit board has a front surface having a front surface-side ground pattern provided at a position opposed to the slot, which includes an opening having an outer shape greater than that of the slot, and a back surface having a back surface-side ground pattern and a strip line surrounded by the back surface-side ground pattern and disposed to cross through the slot, and wherein a distal end of the strip line and the front surface-side ground pattern are coupled together by a via hole, the opening is surrounded by a via hole group which couples the front surface-side ground pattern and the back surface-side ground pattern together, and the dielectric waveguide is disposed in such a manner as to allow the opening and the slot to be opposed to each other.

Effect of the Invention

The present invention makes it possible to provide a dielectric waveguide input/output coupling structure capable of increasing a degree of coupling between the dielectric waveguide and the strip line, and having a wideband characteristic.

DETAILED DESCRIPTION OF THE DRAWINGS

A dielectric waveguide input/output coupling structure of the present invention will now be described with reference to the drawings.

First Embodiment

Figure 1:
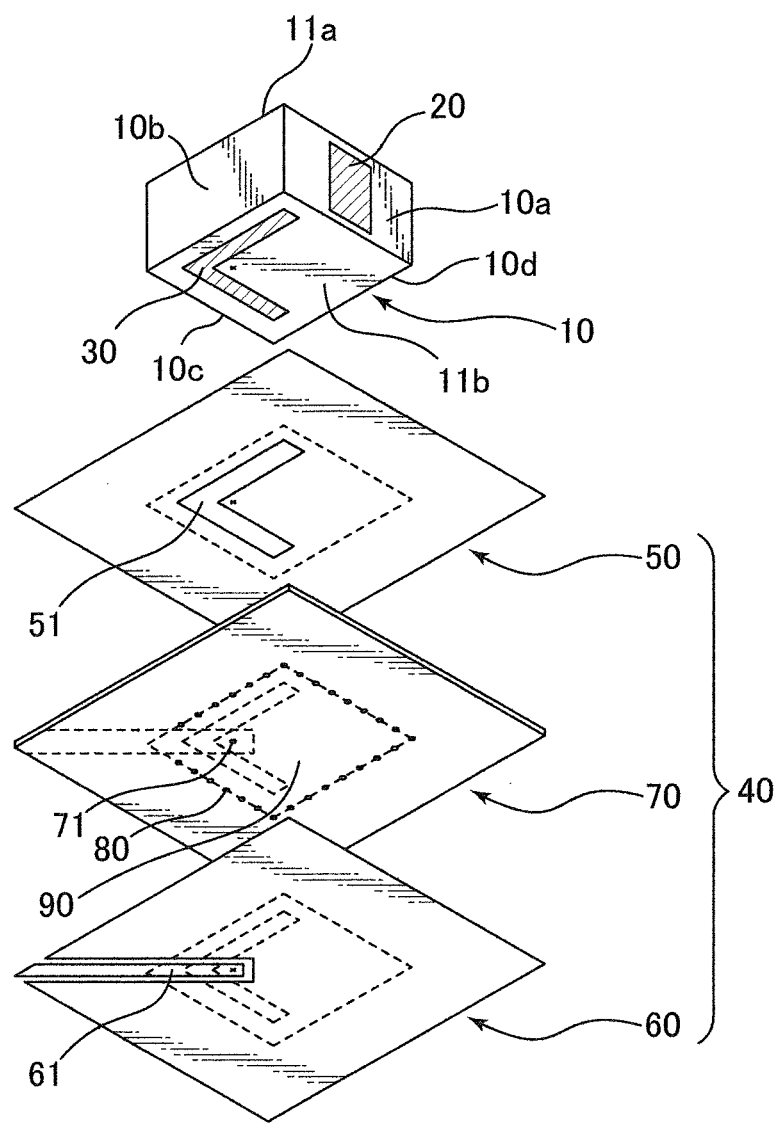
FIG. 1 is an exploded perspective view illustrating a dielectric waveguide input/output coupling structure according to a first embodiment of the present invention.

FIG. 1 is an exploded perspective view of a dielectric waveguide input/output coupling structure according to a first embodiment of the present invention, showing a case of a dielectric waveguide 10 mounted on a surface of a printed circuit board 40. In FIG. 1, a region exposing the dielectric body is slashed.

As illustrated in FIG. 1, the dielectric waveguide 10 comprises a rectangular parallelepiped-shaped dielectric body having an exterior coated with an electrically conductive film.

The dielectric waveguide 10 has a side surface 10a provided with a coupling window 20 exposing the dielectric body in an approximately quadrangular shape, for coupling to other dielectric waveguide, and a bottom surface 11b provided with a slot 30 exposing the dielectric body in an L-shape.

The slot 30 is composed of a linear slot which is located near and is parallel to a side surface 10b, and a linear slot which is located near and is parallel to a side surface 10c, crossing with each other at a right angle near the corner between the side surfaces 10b and 10c.

The printed circuit board 40 has a front surface-side ground pattern 50 provided on an approximately entire front surface of a substrate 70, and a back surface-side ground pattern 60 provided on an approximately entire back surface of the substrate 70.

In the front surface-side ground pattern 50, there is provided an opening 51 exposing the substrate 70 in approximately the same shape as the slot 30 at a position opposed to the slot 30, and in the back surface-side ground pattern 60, there is provided a strip line 61 crossing through the opening 51 from inside to outside of the corner of the opening 51 in spaced-apart relation to the back surface-side ground pattern 60. The strip line 61 crosses at a position having approximately equal distances along the L-shape from each of opposite ends of the opening 51.

A distal end of the strip line 61 and the front surface-side ground pattern 50 are coupled together by a via hole 71.

The opening 51 is surrounded in an approximately quadrangular shape by a via hole group 80 which couples the front surface-side ground pattern 50 and the back surface-side ground pattern 60 together. Hereinafter, the region surrounded by the via hole group is referred to as a surrounded region.

In general, a dielectric resonator has an electrical field intensity which becomes stronger concentrically from the center thereof when viewed from the top. In the dielectric waveguide 10, the closer to the side surfaces 10a, 10b, 10c, 10d, and to the center of the side surfaces, the stronger the electrical field intensity is. Thus, in the dielectric waveguide input/output coupling structure of the present invention, an L-shaped slot 30 formed by two linear slots crossing with each other near the corner between the side surfaces 10b and 10c, each of the linear slots being parallel to respective one of the side surfaces 10b and 10c, is disposed near the adjacent side surfaces 10b and 10c while being aligned therewith, and is coupled to the strip line 61 which crosses with the slot 30 in a planar view. As a result, it becomes possible to increase the degree of coupling between the slot and the strip line, allowing for a wider bandwidth.

Figure 2:
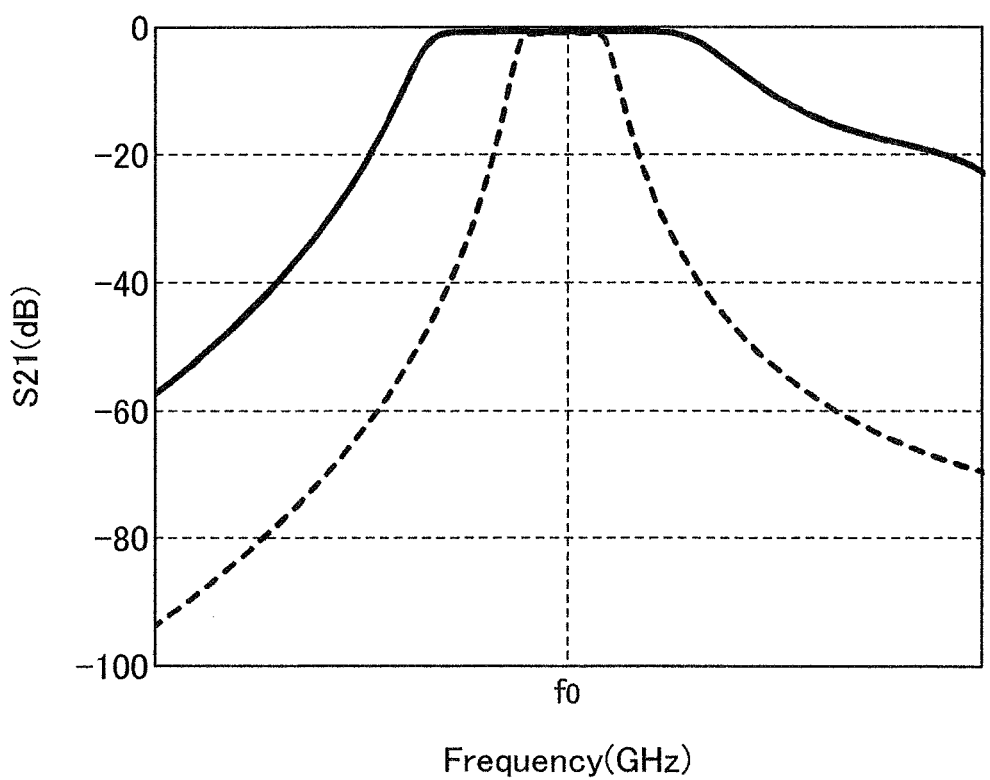
FIG. 2 is a simulation result of comparing the first embodiment of the present invention to a conventional example.

FIG. 2 is a graph illustrating a result of simulation and comparison of characteristics between the dielectric waveguide input/output coupling structure of this embodiment and the conventional dielectric waveguide input/output coupling structure.

In FIG. 2, the vertical axis represents an insertion loss, the horizontal axis represents a frequency, and the dashed line and the solid line represent the conventional dielectric waveguide input/output coupling structure and the dielectric waveguide input/output coupling structure of the first embodiment, respectively.

The result of FIG. 2 shows that the dielectric waveguide input/output coupling structure of the present invention has more than three times wider band characteristics as compared to the conventional dielectric waveguide input/output coupling structure.

In the embodiment described above, the slot 30 may be provided while being aligned with any two adjacent surfaces except for the side surface 10a having the coupling window 20. That is, the slot 30 may be disposed while being aligned with the side surfaces 10b and 10c, or with the side surfaces 10c and 10d.

Further, in the dielectric waveguide input/output coupling structure described above, the outer shapes of the opening 51 and the slot 30 are approximately the same, but in an actual case, the outer shape of the opening 51 is determined by the shape defined by outer shapes of the opening 51 and the slot 30 overlapping with each other. Therefore, by having an outer shape of the opening 51 which is slightly larger than that of the slot 30, it is possible to minimize degradation of characteristics due to misalignment occurring in mounting the dielectric waveguide on the printed circuit board.

Second Embodiment

In the first embodiment, in order to achieve a larger bandwidth of the input/output coupling structure, the slot size must be made larger to some extent, and accordingly, the surrounded region must also be made larger. However, large surrounded region 90 causes reduction in resonant frequency thereof to get close to a resonant frequency $f_0$ of the dielectric waveguide 10, which adversely affects frequency characteristics on higher frequency side of the dielectric waveguide.

Figure 3:
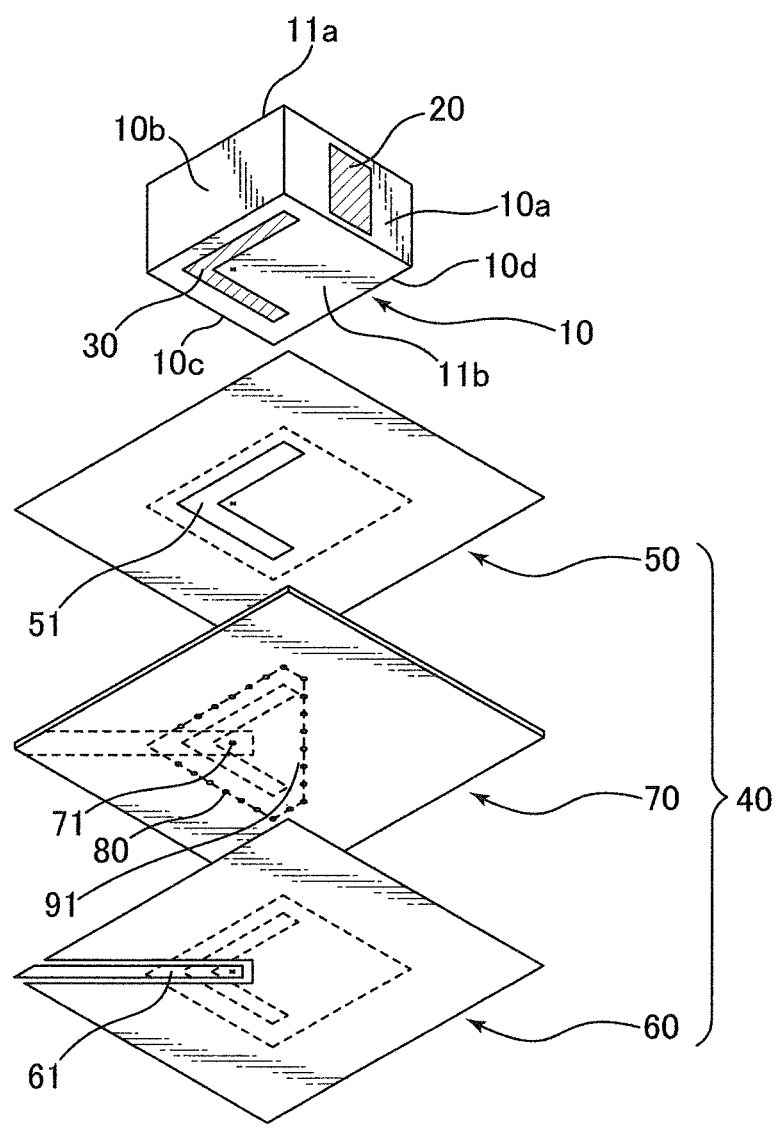
FIG. 3 is an exploded perspective view illustrating a dielectric waveguide input/output coupling structure according to a second embodiment of the present invention.

FIG. 3 is an exploded perspective view of a dielectric waveguide input/output coupling structure according to a second embodiment of the present invention. In this embodiment, the shape of surrounded region is modified from the embodiment in FIG. 1. In FIG. 3, like reference numerals are applied to the same parts and portions as in FIG. 1, and detailed description thereof will be omitted.

As illustrated in FIG. 3, the surrounded region 91 is chamfered at one corner which is opposed to the L-shaped corner of the approximately quadrangular shaped slot 30.

Figure 4:
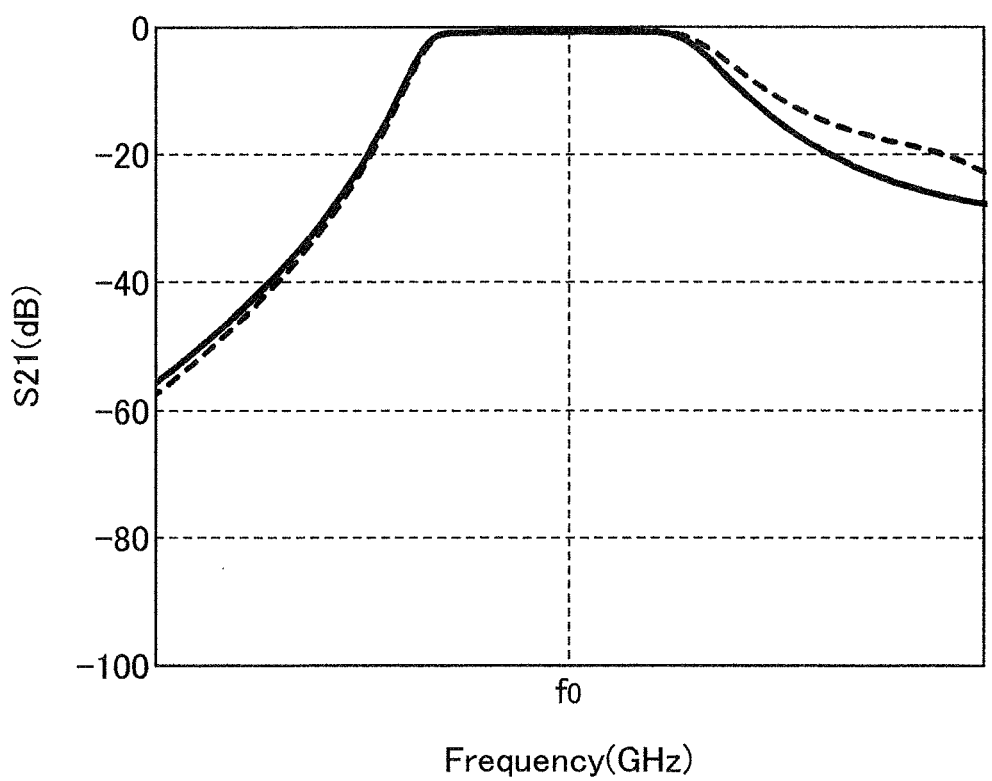
FIG. 4 is a simulation result of comparing the second embodiment to the first embodiment of the present invention.
Figure 5:
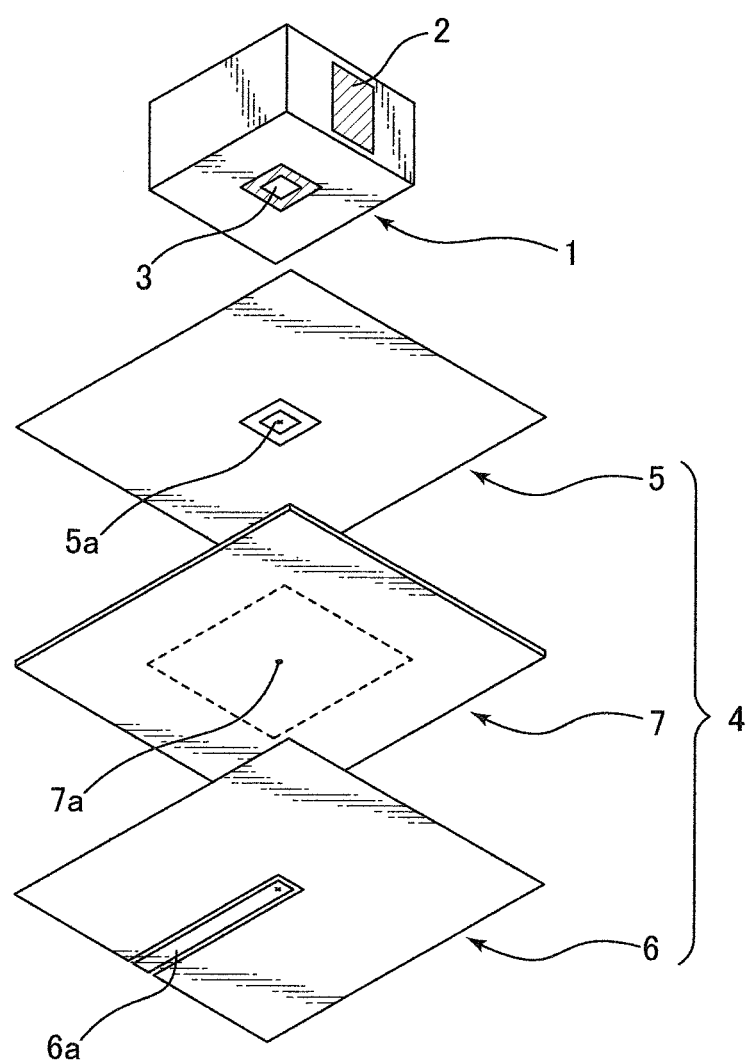
FIG. 5 is an exploded perspective view illustrating an example of a conventional dielectric waveguide input/output coupling structure.

FIG. 4 is a graph illustrating a result of simulation of characteristics of the dielectric waveguide input/output coupling structure as illustrated in FIG. 3. In FIG. 4, the vertical axis represents an insertion loss, the horizontal axis represents a frequency, and the solid line and the dashed line represent the dielectric waveguide input/output coupling structure of the second embodiment and the dielectric waveguide input/output coupling structure of the first embodiment for comparison, respectively.

As is obvious from FIG. 4, the dielectric waveguide input/output coupling structure of this embodiment has a frequency characteristic which is steep on higher frequency side, as compared to the dielectric waveguide input/output coupling structure of the first embodiment.

It is believed that this is because effect of resonance in the surrounded region could be reduced.

In this way, by the surrounded region having a shape chamfered at one corner of the approximately quadrangular shape, the characteristic of the dielectric waveguide input/output coupling structure can be improved.

As described above, the present invention makes it possible to provide a dielectric waveguide input/output coupling structure which exhibits large degree of coupling and wideband characteristics.

Although embodiments of the present invention has been described, it should be understood that the present invention is not intended to be limited to the embodiments described above, and various modifications and substitutions may be made without departing from the scope of the present invention.

For example, a coupling window is used in the dielectric waveguide as a coupling portion for coupling to other dielectric waveguide, but the coupling portion is not limited to the coupling window. A dielectric plate having a different permittivity (dielectric constant) than that of a dielectric waveguide may be used. Further, grooves may be provided in both side surfaces of a rod-like dielectric body to integrally form a dielectric waveguide with other dielectric waveguide.

EXPLANATION OF CODES 1, 10: dielectric waveguide
4, 40: printed circuit board
5, 50: front surface-side ground pattern
6, 60: back surface-side ground pattern
7, 70: substrate
3, 5a: electrode
30: slot
51: opening
6a: 61: strip line
7a, 71: via hole
80: via hole group
90, 91: surrounded region

The invention claimed is:

1. A dielectric waveguide input/output coupling structure for coupling an electrode of a dielectric waveguide and a strip line on a printed circuit board together, the dielectric waveguide being configured to be coupled to other dielectric waveguide, wherein:

the dielectric waveguide comprises an approximately rectangular parallelepiped-shaped dielectric body having an exterior coated with an electrically conductive film, and has one side surface having a coupling region for coupling to other dielectric waveguide, and a bottom surface having a slot for exposing the dielectric body in an L-shape, the L-shape being formed by two linear slots crossing with each other at their end portions, each of the linear slots being parallel to respective one of two adjacent side surfaces, except for the one side surface, of the dielectric waveguide;

the printed circuit board has a front surface having a front surface-side ground pattern provided at a position opposed to the slot, which includes an opening having an outer shape greater than that of the slot, and a back surface having a back surface-side ground pattern and a strip line surrounded by the back surface-side ground pattern and disposed to cross through the slot, and wherein a distal end of the strip line and the front surface-side ground pattern are coupled together by a via hole, the opening is surrounded by a via hole group which couples the front surface-side ground pattern and the back surface-side ground pattern together, and the dielectric waveguide is disposed in such a manner as to allow the opening and the slot to be opposed to each other.

2. The dielectric waveguide input/output coupling structure as defined in claim 1, wherein the strip line and the slot cross with each other at a position having approximately equal distances along the opening from each of opposite ends of the slot.

3. The dielectric waveguide input/output coupling structure as defined in claim 2, wherein the via hole is located near the slot.

4. The dielectric waveguide input/output coupling structure as defined in claim 2, wherein the via hole group surrounds the opening in a triangular shape formed by chamfering one corner of a quadrangular shape.

* * * * *